United States Patent [19]

Ueno

[11] Patent Number: 4,904,924
[45] Date of Patent: Feb. 27, 1990

[54] OUTPUT CIRCUIT FOR OUTPUTTING A LEVEL SHIFTED OUTPUT SIGNAL

[75] Inventor: Masaji Ueno, Kanagawa, Japan

[73] Assignee: Kabushiki Kaisha Toshiba, Kanagawa, Japan

[21] Appl. No.: 362,552

[22] Filed: Jun. 7, 1989

[30] Foreign Application Priority Data

Jul. 8, 1988 [JP] Japan .................................. 63-170686

[51] Int. Cl.⁴ .............................................. H03K 5/13
[52] U.S. Cl. .................................... 323/351; 323/314;
 307/264; 307/475
[58] Field of Search ............... 323/349, 350, 351, 311,
 323/312, 313, 314, 317, 282, 283, 284, 271, 272;
 307/260, 261, 264, 446, 448, 475

[56] References Cited

U.S. PATENT DOCUMENTS

| 4,565,960 | 1/1986 | Takata et al. | 323/351 |
| 4,656,374 | 4/1987 | Rapp | 307/264 |
| 4,694,201 | 9/1987 | Jason | 307/475 |
| 4,695,750 | 9/1987 | Hara et al. | 307/264 |
| 4,707,623 | 11/1987 | Bismarck | 307/475 |
| 4,713,600 | 12/1987 | Tsugaru et al. | 323/351 |
| 4,779,016 | 10/1988 | Sugiyama et al. | 307/264 |

FOREIGN PATENT DOCUMENTS 1109907 8/1984 U.S.S.R. ............................ 323/351

Primary Examiner—Peter S. Wong
Attorney, Agent, or Firm—Finnegan, Henderson, Farabow, Garrett and Dunner

[57] ABSTRACT

An output circuit provides a high voltage output signal in response to a low voltage input signal. The output circuit includes a pull-up transistor for raising the output signal substantially to a power source voltage level and a pull-down transistor responsive to the input signal for lowering the output signal substantially to the ground level. The pull-up transistor is biased by a self-bias circuit triggered by a prescribed level of a control signal. The self-bias circuit continues to bias the pull-up MOS transistor in order to bring the output signal level to the high voltage level, even if the prescribed level period of the control signal terminates.

12 Claims, 3 Drawing Sheets

OUTPUT CIRCUIT FOR OUTPUTTING A LEVEL SHIFTED OUTPUT SIGNAL

BACKGROUND OF THE INVENTION

1. Field of the Invention

This invention concerns an output circuit for outputting a high voltage output signal in response to a low voltage input signal.

2. Description of the Prior Art

Generally, a high voltage driving integrated circuit (IC) is used to drive a light emitting display, such as an electro luminescence (EL) display or a plasma display panel (PDP), since such display requires a high driving voltage.

In the driving circuit, a reduction of the switching time and the power consumption is required in addition to the requirement of the high voltage. Thus, a CMOS circuit is utilized to receive the input signal, and the output signal from the CMOS circuit is level shifted to a high voltage level by a push-pull type output stage. Usually, a DMOS (Double diffused MOS) transistor is used in the output stage.

FIG. 1 shows a circuit diagram of a conventional output circuit. In the circuit, a CMOS inverter circuit 3 including a P-channel type MOS transistor 1 and an N-channel type MOS transistor 2, is connected between the low power source voltage VDD and the ground VSS. The gate electrodes of the MOS transistors 1 and 2 are connected to the input terminal In.

The gate electrode of an N-channel type MOS transistor 5 is connected to the drain electrodes of the MOS transistors 1 and 2. The source electrode of the MOS transistor 5 is connected to the ground VSS.

The emitter electrode and a collector electrode of a multi-collector bipolar transistor 4 is connected to the drain electrode of the MOS transistor 5. The emitter electrode of the bipolar transistor 4 is supplied with a high power source voltage VCC.

The gate electrode of a pull-up MOS transistor 7 is connected to the remaining collector electrode of the bipolar transistor 4. The drain electrode of the MOS transistor 7 is supplied with the high power source voltage VCC. The source electrode of the MOS transistor 7 is connected to the output terminal Out.

The cathode and the anode of a Zener diode 8 are connected to the gate and the source electrode of the pull-up MOS transistor 7, respectively.

The source electrode of a pull-down MOS transistor 6 is connected to the ground VSS, and the drain electrode thereof is connected to the gate electrode of the pull-up MOS transistor 7.

The operation of the circuit is as follows. When the input signal IN is low level, the MOS transistor 1 in the CMOS inverter circuit 3 changes to the ON state, and the MOS transistor 2 changes to the OFF state. Thus, the MOS transistor 5 and the bipolar transistor 4 change to the ON state. Therefore, a predetermined voltage drop is developed at the Zener diode 8, and the pull-up MOS transistor 7 changes to the ON state. Thus, the parasitic capacitance and the load capacitance (not shown) at the output terminal Out are charged by the current of the MOS transistor 7, and the output signal level is raised substantially to the high power source voltage level VCC.

When the input signal IN changes to the high level, the MOS transistor 2 in the CMOS inverter circuit 3 changes to the ON state, and the MOS transistor 1 changes to the OFF state. Thus, the transistor 5 changes to the OFF state.

On the other hand, the pull-down transistor 6 changes to the ON state, since the input signal of the high level is supplied thereto. As the result, the parasitic capacitance and the load capacitance at the output terminal Out are discharged through the pull-down transistor 6, and the output signal level is lowered substantially to the ground level VSS.

In this circuit, it is necessary to continue the current supply by the bipolar transistor 4 for maintaining the MOS transistor 7 at the ON state to raise the output signal level to high level. Furthermore, a predetermined current continually flows through the bipolar transistor 4 and the MOS transistor 5 when the output signal level is high level, even if the output signal level becomes high level and the pull-up transistor 7 changes to the OFF state.

For example, the power consumption P becomes as follows assuming the current which flows through the MOS transistor 5 is 150 μA and the high power source voltage VCC is 200 volts.

$$P = 200 \times 150 \times 10^{-5} = 30 \, mW \qquad (1)$$

Thus, the power consumption P becomes about 1 W when the display is 32 bits, since 32 output circuits shown in FIG. 1 are required. The more the output bits of the display, the more the power consumption.

SUMMARY OF THE INVENTION

Therefore, an object of the present invention is to provide a high voltage output circuit having a low power consumption.

To achieve the object, this invention provides an output circuit responsive to an input signal having a first voltage level for a prescribed period and a second voltage level for a specified period, a reference voltage and a power source voltage, comprising: control signal generating means responsive to the input signal for outputting a control signal having a predetermined voltage level for a short period less than the prescribed period following the prescribed period of the input signal; self-bias circuit means for producing a bias voltage established in a self-bias manner and triggered by the control signal; pull-up circuit means biased by the bias voltage of the self-bias circuit means for raising the voltage level of the output signal substantially to the level of the power source voltage; and pull-down circuit means responsive to the first voltage level of the input signal for lowering the voltage level of the output signal substantially to the level of the reference voltage.

BRIEF DESCRIPTION OF THE DRAWINGS

The accompanying drawings, which are incorporated in and constitute a part of the specification, illustrate an embodiment of the invention, and, together with the description, serve to explain the principles of the invention. Referring now to the drawings, like reference characters designate like or corresponding parts throughout the several views. Of the drawings:

FIG. 4 is a circuit diagram of another embodiment according to the present invention.

DETAILED DESCRIPTION OF THE INVENTION

Figure 1:
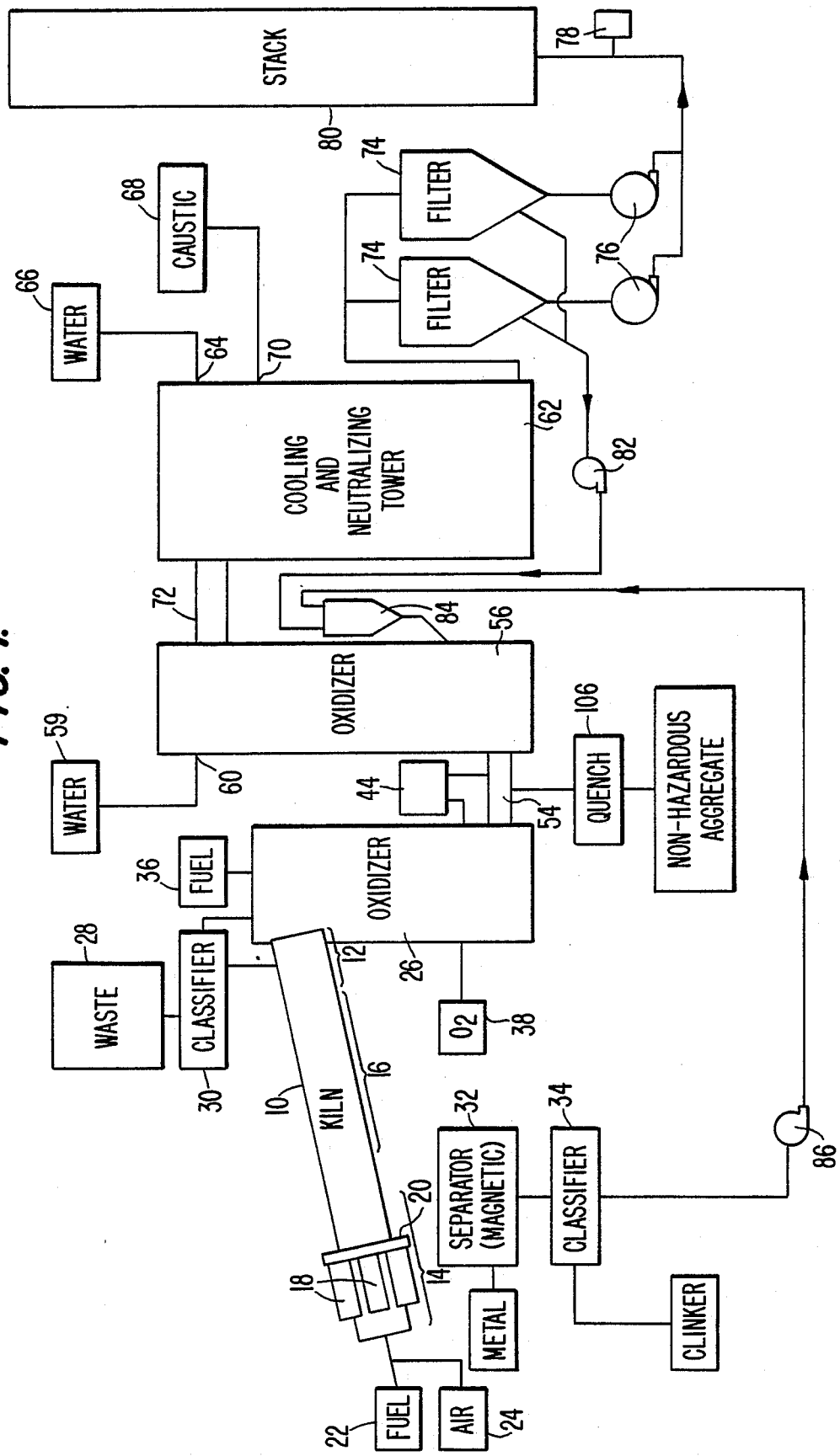
FIG. 1 is a circuit diagram of a conventional output circuit.
Figure 2:
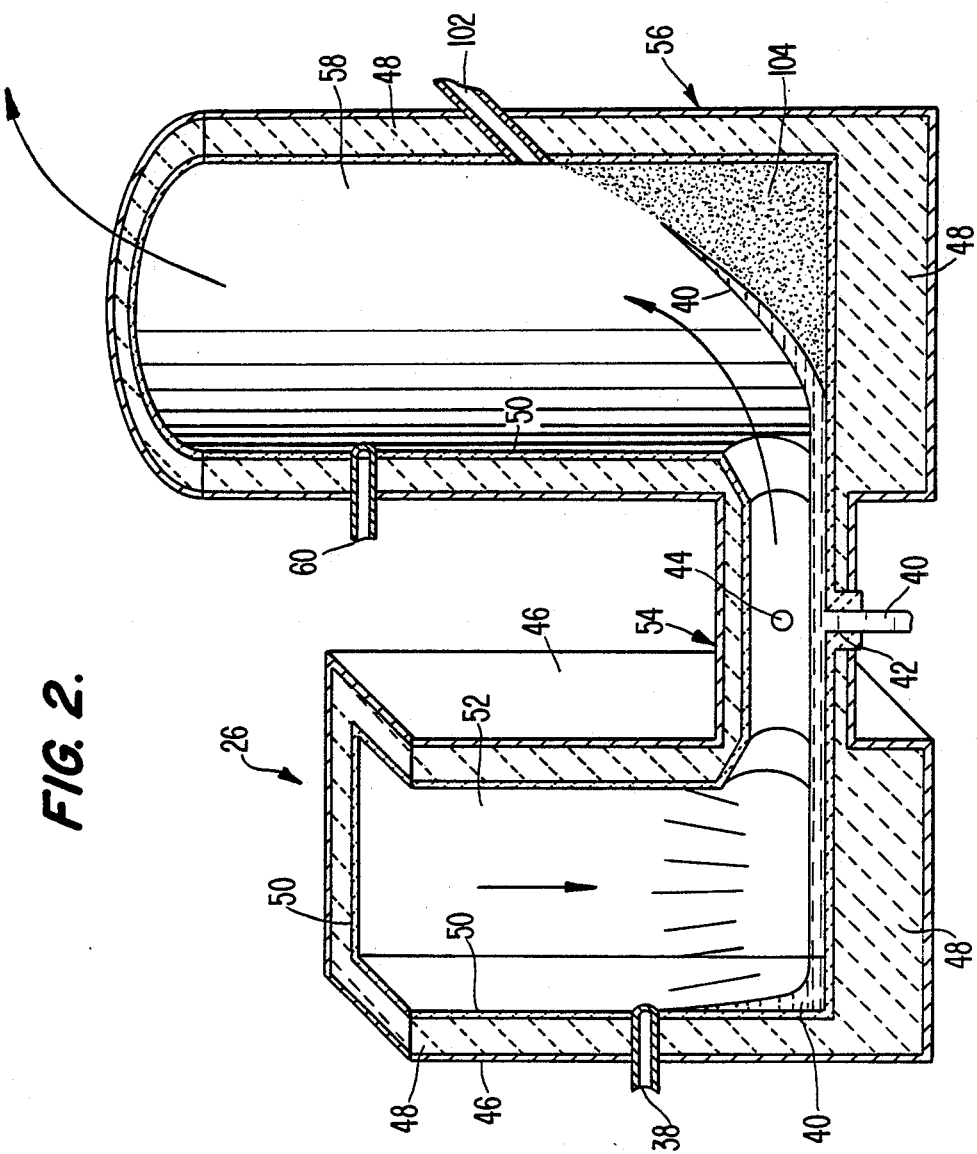
FIG. 2 is a circuit diagram of a preferred embodiment according to the present invention.

Referring now to FIG. 2, there is illustrated a circuit diagram of a preferred embodiment according to the present invention.

In FIG. 2, an input signal IN having a high level and a low level is supplied to an input terminal In.

Figure 3:
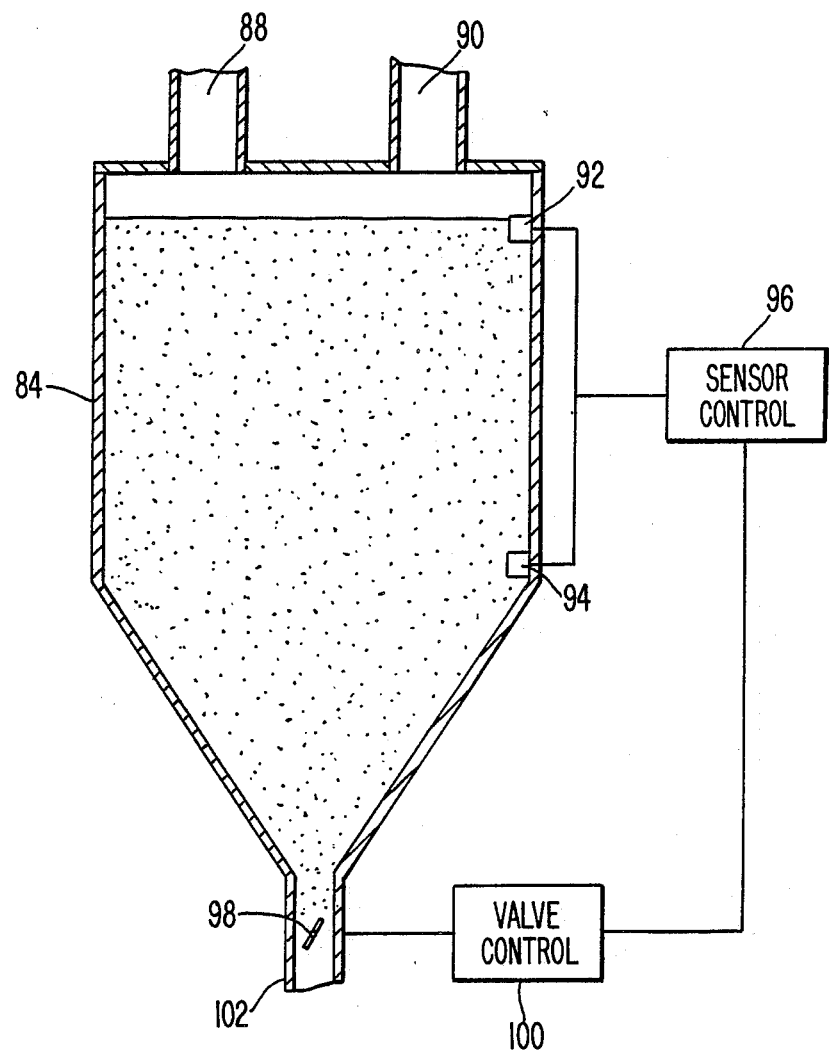
FIG. 3 shows various signal waveforms.

In this invention, there is provided control signal generating means. In the preferred embodiment of FIG. 2, a control signal generating means 11 includes a NOR gate 12 which receives the input signal IN and a trigger signal Φ from an external circuit (not shown). The trigger signal Φ has a low level for a predetermined period after the high level period of the input signal IN terminates. The NOR gate 12 outputs a control signal VG as illustrated in FIG. 3 in response to the input signal IN and the trigger signal Φ. Namely, the control signal VG has a high level period following the high level period of the input signal IN. Since the control signal VG is a logical NOR output signal of the trigger signal Φ and the input signal IN, it is possible to obtain the control signal VG as long as the trigger signal Φ has a low level period which at least overlaps the transition area of the input signal IN.

The control signal generating means 11 further includes an N-channel type DMOS (Double diffused MOS) transistor 13. The gate electrode of the DMOS transistor 13 is connected to the NOR gate 12 to receive the control signal VG, and the source electrode thereof is connected to the ground VSS.

In this invention, there is provided self-bias circuit means. In the preferred embodiment of FIG. 2, a self-bias circuit means 4 includes a PNP type bipolar transistor 17, an N-channel MOS transistor 16, a resistor 15 and a Zener diode 18.

The base electrode of the bipolar transistor 17 is connected to the drain electrode of the DMOS transistor 13, and the emitter electrode thereof is supplied with the power source voltage VCC. For example, the voltage level of the power source voltage VCC is 200 volts. The resistor 15 is connected between the base electrode and the emitter electrode of the bipolar transistor 17.

The drain electrode of the MOS transistor 16 is connected to the base electrode of the bipolar transistor 17, and the source electrode thereof is connected to the output terminal Out. The gate electrode of the MOS transistor 16 is connected to the collector electrode of the bipolar transistor 17.

The cathode of the Zener diode 18 is connected to the gate electrode of the MOS transistor 16, and the anode thereof is connected to the output terminal Out. Since the gate to source voltage of the MOS transistor 16 is restricted by the constant voltage of the Zener diode 18, the operation of the MOS transistor 16 is stabilized. Furthermore, it is possible to prevent the destruction of the MOS transistor 16 due to a high gate to source voltage.

In this invention, there is provided pull-up circuit means in response to the bias voltage of the self bias circuit means for raising the output signal level substantially to the power source voltage level. In the preferred embodiment of FIG. 2, a pull-up circuit means 19 includes a pull-up MOS transistor 20. The gate electrode of the pull-up MOS transistor 20 is connected to the gate electrode of the MOS transistor 16, and the drain electrode thereof is supplied with the power source voltage VCC. The source electrode of the pull-up MOS transistor 20 is connected to the output terminal Out.

In this invention, there is provided pull-down means in response to the input signal for lowering the output signal level substantially to the reference voltage level. In the preferred embodiment of FIG. 2, a pull-down means 21 includes an N-channel MOS transistor 22. The gate electrode of the MOS transistor 22 is connected to the input terminal In, and the source electrode thereof is connected to the ground VSS. The drain electrode of the MOS transistor 22 is connected to the gate electrodes of the MOS transistors 20 and 16.

The operation of the circuit will be explained referring to FIG. 3, which illustrates the wave forms of the input signal IN, the trigger signal Φ and the control signal VG. When the input signal IN is high level, the pull-down transistor 22 changes to the ON state. Thus, the gate potential of the MOS transistors 16 and 20 changes to the low level, and the parasitic capacitance and the load capacitance at the output terminal Out are discharged through the Zener diode 18. Thus, the output signal level is lowered substantially to the ground level VSS.

When the input signal IN changes from the high level to the low level, the pull-down transistor 22 changes to the OFF state. At the transition of the input signal from the high level to the low level, the control signal VG changes from the low level. As the result, the MOS transistor 13 changes to the ON state. Thus, a predetermined current flows through the transistor 13 to produce a predetermined voltage drop at the resistor 15. The bipolar transistor 17 changes to the ON state due to the voltage drop at the resistor 15, and a predetermined voltage drop is produced at the Zener diode 18. When the voltage drop at the Zener diode 18 exceeds the threshold voltage of the transistors 16 and 20, the MOS transistors 16 and 20 change to the ON state. Thus, the parasitic capacitance and the load capacitance are charged and the output signal level is raised substantially to the power source voltage level VCC.

When the control signal VG changes to the low level, the MOS transistor 13 changes to the OFF state. However, when the bipolar transistor 17 changes to the ON state once, the MOS transistor 16 changes to the ON state and the voltage drop at the resistor 15 biases the bipolar transistor 17 to maintain the ON state in a self-bias manner. Thus, even if the MOS transistor 13 changes to the OFF state, the pull-up MOS transistor 20 maintains the ON state. Therefore, it is not necessary to maintain the MOS transistor 13 at the ON state to raise the output signal level substantially to the power source voltage level VCC. Namely, it is sufficient to change the MOS transistor 13 to the ON state during only the period corresponding to the period when the control signal VG is high level. Thus the power consumption of the circuit can be significantly reduced.

When the output voltage level is raised to the high level, the current which flows through the pull-up MOS transistor 20 stops.

FIG. 4 is a circuit diagram of another embodiment according to the present invention. In the circuit of FIG. 4, the pull-down means 30 includes a second pull-down MOS transistor 32 in addition to a first pull-down MOS transistor 31 corresponding to the MOS transistor 22 in FIG. 2. The drain electrode of the first pull-down MOS transistor 31 is directly connected to the output terminal Out, and the the source electrode thereof is connected to the ground VSS.

The input signal IN is supplied to the gate electrode of the second pull-down MOS transistor 32 through a delay circuit 33, including a NAND circuit 34 and two inverters 35 and 36. Therefore, the input signal to the MOS transistor 32 is delayed for a predetermined time with respect to the input signal to the gate electrode of the MOS transistor 31. Thus, at the pull-down operation, the MOS transistor 31 changes to the ON state first, and the MOS transistor 32 changes to the ON state after the predetermined time.

By adding the MOS transistor 32, the driving capacity is increased. In other words, it is possible to make the size of the first pull-down MOS transistor 31 relatively small. Thus, the parasitic capacitance of the MOS transistor 31 to be charged by the current from the bipolar transistor 17 can be made small. Thus, the switching time of the circuit can be made small.

The pull-up MOS transistor 20 changes to the OFF state prior to the change of the MOS transistor 32 to the ON state, since the MOS transistor 31 changes to the ON state prior to the change of the MOS transistor 32. Therefore, a through current between the power source terminal VCC and the ground VSS can be prevented. In the aforementioned embodiments, a bipolar transistor 17 is used in the self-bias circuit means. However, a MOS transistor can be used for the bipolar transistor.

The present invention has been described with respect to a specific embodiment. However, other embodiments based on the principles of the present invention should be obvious to those of ordinary skill in the art. Such embodiments are intended to be covered by the claims.

What is claimed is:

1. An output circuit responsive to an input signal having a first voltage level for a prescribed period and a second voltage level for a specified period, a reference voltage and a power source voltage, comprising:
    control signal generating means responsive to the input signal for outputting a control signal having a predetermined voltage level for a short period less than the prescribed period following the prescribed period of the input signal;
    self-bias circuit means for producing a bias voltage established in a self-bias manner and triggered by the control signal;
    pull-up circuit means biased by the bias voltage of the self-bias circuit means for raising the voltage level of the output signal substantially to the level of the power source voltage; and
    pull-down circuit means responsive to the first voltage level of the input signal for lowering the voltage level of the output signal substantially to the level of the reference voltage.

2. The output circuit according to claim 1, wherein the self-bias circuit means includes;
    a bipolar transistor having a bipolar base electrode supplied with the control signal, a bipolar emitter electrode supplied with the power source voltage and a bipolar collector electrode;
    a first MOS transistor having a first gate electrode connected to the bipolar collector electrode and a first drain electrode connected to the bipolar base electrode and a first source electrode; and
    a resistor connected between the bipolar base and the bipolar emitter electrodes.

3. The output circuit according to claim 2, wherein the self-bias circuit means further includes a Zener diode having a cathode electrode connected to the first gate electrode and an anode electrode connected to the first source electrode.

4. The output circuit according to claim 3, wherein the pull-up circuit means includes a second MOS transistor having a second gate electrode connected to the first gate electrode, a second drain electrode supplied with the power source voltage and a second source electrode connected to the first source electrode.

5. The output circuit according to claim 4, wherein the pull-down circuit means includes a third MOS transistor having a third gate electrode supplied with the input signal, a third drain electrode connected to the first and second gate electrodes and a third source electrode supplied with reference voltage.

6. The output circuit according to claim 5, wherein the pull-down circuit means further includes a fourth MOS transistor having a fouth gate electrode and a fourth drain electrode connected to the second source electrode, and delay circuit means for supplying a delayed input signal to the fourth gate electrode.

7. An output circuit for outputting a high voltage output signal in response to a power source voltage, a reference voltage and a low voltage input signal having a first voltage level for a prescribed period and a second voltage level for a specified period, for discharging a capacitance connected to an output terminal during the prescribed period and for charging the capacitance during the specified period, comprising:
    control signal generating means responsive to the input signal for outputting a control signal having a predetermined voltage level for a predetermined period shorter than the specified period of the input signal and following the prescribed period of the input signal;
    pull-up circuit means for supplying a predetermined current to the output terminal to charge the capacitance;
    self-bias circuit means for biasing the pull-up circuit means by supplying a predetermined bias voltage established in a self-bias manner and triggered by the control signal and
    pull-down circuit means responsive to the input signal for discharging the capacitance.

8. The output circuit according to claim 7, wherein the self-bias means includes a bipolar transistor having a bipolar base electrode supplied with the control signal, a bipolar emitter electrode supplied with the power source voltage and a bipolar collector electrode;
    a first MOS transistor having a first gate electrode connected to the bipolar collector electrode, a first source electrode connected to the output terminal and a first drain electrode connected to the bipolar base electrode;
    a resistor connected between the bipolar base and the bipolar emitter electrodes; and
    a Zener diode connected between the first source and the first gate electrodes.

9. The output circuit according to claim 8, wherein the pull-up circuit means includes a second MOS transistor having a second gate electrode connected to the first gate electrode, a second drain electrode supplied with the power source voltage and a second source electrode connected to the output terminal.

10. The output circuit according to claim 9, wherein the pull-down circuit means includes a third MOS transistor having a third gate electrode supplied with the input signal, a third drain electrode connected to the first and second gate electrodes and a third source electrode supplied with the reference voltage.

11. The output circuit according to claim 10, wherein the pull-down circuit means further includes a fourth MOS transistor having a fourth gate electrode, a fourth source electrode supplied with the reference voltage and a fourth drain electrode connected to the output terminal; and delay circuit means for supplying to the fourth gate electrode a delayed input signal with respect to the input signal to the third MOS transistor.

12. The output circuit according to claim 11, wherein a trigger signal is supplied to the circuit from an external source, and the control signal generating means includes a NOR gate supplied with the input signal and the trigger signal.

* * * * *

UNITED STATES PATENT AND TRADEMARK OFFICE
CERTIFICATE OF CORRECTION

PATENT NO. : 4,904,924
DATED : February 27, 1990
INVENTOR(S) : Masaji Ueno

It is certified that error appears in the above-identified patent and that said Letters Patent is hereby corrected as shown below:

Claim 7, column 6, line 44, change "signal" to
　--signal;--.

Signed and Sealed this

Eighth Day of December, 1992

Attest:

DOUGLAS B. COMER

*Attesting Officer*　　　　*Acting Commissioner of Patents and Trademarks*